United States Patent
Jang et al.

(10) Patent No.: US 7,936,023 B1
(45) Date of Patent: May 3, 2011

(54) HIGH VOLTAGE DIODE

(75) Inventors: Jaejune Jang, Santa Clara, CA (US);
Bill Phan, San Jose, CA (US); Helmut Puchner, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 112 days.

(21) Appl. No.: 11/861,013

(22) Filed: Sep. 25, 2007

Related U.S. Application Data

(60) Provisional application No. 60/826,996, filed on Sep. 26, 2006.

(51) Int. Cl.
*H01L 23/62* (2006.01)

(52) U.S. Cl. ......... 257/373; 257/E27.051; 257/E29.328; 257/494

(58) Field of Classification Search ................ 257/653, 257/494, 362, 367, 373, E27.051, E27.073, 257/E29.012, E29.328
See application file for complete search history.

(56) References Cited

U.S. PATENT DOCUMENTS

| | | |
|---|---|---|
| 5,029,063 A | 7/1991 | Lingstaedt et al. |
| 5,159,204 A | 10/1992 | Bernacchi et al. |
| 5,270,588 A | 12/1993 | Choi |
| 5,436,587 A | 7/1995 | Cernea |
| 5,521,546 A | 5/1996 | Kim |
| 5,521,547 A | 5/1996 | Tsukada |
| 5,550,486 A | 8/1996 | Sweeney |
| 5,675,240 A | 10/1997 | Fujisawa et al. |
| 5,852,552 A | 12/1998 | Kwon |
| 5,880,620 A | 3/1999 | Gitlin et al. |
| 5,939,928 A | 8/1999 | Le et al. |
| 5,943,226 A | 8/1999 | Kim |
| 5,999,020 A | 12/1999 | Volk et al. |
| 6,008,689 A | 12/1999 | Au et al. |
| 6,049,473 A | 4/2000 | Jang et al. |
| 6,184,594 B1 | 2/2001 | Kushnarenko |
| 6,198,340 B1 | 3/2001 | Ting et al. |
| 6,198,342 B1 | 3/2001 | Kawai |
| 6,208,196 B1 | 3/2001 | St. Pierre |
| 6,593,725 B1 | 7/2003 | Gallagher et al. |
| 7,023,259 B1 | 4/2006 | Daniell et al. |
| 2005/0012156 A1* | 1/2005 | Yeh et al. ........................ 257/367 |
| 2005/0068103 A1* | 3/2005 | Dupuis et al. ................... 330/251 |
| 2006/0006923 A1* | 1/2006 | Kapoor ........................... 327/534 |
| 2006/0044719 A1* | 3/2006 | Chen et al. ........................ 361/56 |
| 2006/0273403 A1* | 12/2006 | Suzuki et al. ................... 257/371 |
| 2008/0029782 A1* | 2/2008 | Carpenter et al. ............... 257/173 |

OTHER PUBLICATIONS

Encyclopedia of Chemical Technology, Kirk-Othmer, vol. 14, p. 692, (1995).*
Encyclopedia of Chemical Technology, Kirk-Othmer, vol. 14, pp. 677-709, (1995).
USPTO Notice of Allowance for U.S. Appl. No. 09/790,749 dated Mar. 12, 2003; 4 pages.
USPTO Non-Final Rejection for U.S. Appl. No. 09/790,749 dated Oct. 4, 2002; 5 pages.
USPTO Notice of Allowance for U.S. Appl. No. 09/793,359 dated Nov. 4, 2005; 7 pages.

(Continued)

*Primary Examiner* — Minh-Loan T Tran

(57) ABSTRACT

A diode, includes a semiconductor substrate, a first region doped with a first dopant type in the substrate, a second region doped with a second dopant type in the substrate, a first well of the first dopant type in the substrate and surrounding the first region and the second region, and a second well of the second dopant type in the substrate connecting the first region and the second region. The first dopant type is opposite the second dopant type.

18 Claims, 2 Drawing Sheets

OTHER PUBLICATIONS

USPTO Advisory Action for U.S. Appl. No. 09/793,359 dated Aug. 23, 2005; 2 pages.
USPTO Final Rejection for U.S. Appl. No. 09/793,359 dated Jun. 28, 2005; 7 pages.
USPTO Advisory Action for U.S. Appl. No. 09/793,359 dated Apr. 21, 2005; 2 pages.
USPTO Final Rejection for U.S. Appl. No. 09/793,359 dated Feb. 9, 2002; 6 pages.
USPTO Final Rejection for U.S. Appl. No. 09/793,359 dated Oct. 19, 2005; 7 pages.
USPTO Non-Final Rejection for U.S. Appl. No. 09/793,359 dated Jun. 3, 2004; 7 pages.
USPTO Advisory Action for U.S. Appl. No. 09/793,359 dated Apr. 21, 2004; 3 pages.
USPTO Final Rejection for U.S. Appl. No. 09/793,359 dated Jan. 29, 2004; 5 pages.
USPTO Non-Final Rejection for U.S. Appl. No. 09/793,359 dated Sep. 8, 2003; 7 pages.
USPTO Final Rejection for U.S. Appl. No. 09/793,359 dated May 6, 2003; 7 pages.
USPTO Non-Final Rejection for U.S. Appl. No. 09/793,359 dated Jan. 15, 2003; 6 pages.
USPTO Advisory Action for U.S. Appl. No. 09/793,359 dated Aug. 13, 2002; 3 pages.
USPTO Final Rejection for U.S. Appl. No. 09/793,359 dated May 23, 2002; 6 pages.
USPTO Non-Final Rejection for U.S. Appl. No. 09/793,359 dated Dec. 19, 2001; 5 pages.
Specification of the Bluetooth System, Specification vol. 1, Version 1.0, Dec. 1, 1999; pp. Jan. 1080; 1080 pages.
Specification of the Bluetooth System, Specification vol. 2, Version 1.0, Dec. 1, 1999; pp. 1-438; 438 pages.
Robert F. Pierret, "Semiconductor Device Fundamentals," Addison-Wesley, 1996, pp. 525-530 and 149-174; 34 pages.
Wolf, Silicon Processing for the VLSI Era, Lattice Press, 1986,1990, 1995, 2002 (vols. 1-4, respectively), pp. 550-556; 7 pages.
Peter Van Zant, Microchip Fabrication, 3rd. edition, McGraw-Hill, 2004, chapter 16, pp. 491-527; 39 pages.

* cited by examiner

HIGH VOLTAGE DIODE

CROSS-REFERENCE TO RELATED APPLICATION

This application claims priority to provisional application No. 60/826,996 entitled "HIGH VOLTAGE DIODE" filed 26 Sep. 2006, the entire contents of which are hereby incorporated by reference, except where inconsistent with the present application.

BACKGROUND

A CMOS embedded high voltage diode is a semiconductor device typically included in a voltage regulator or a high voltage switch. FIG. 1 illustrates a conventional CMOS embedded high voltage diode 10. As shown in FIG. 1, a lightly P-doped semiconductor substrate 20 (P-substrate) includes a low N-doped drift region 15 (N-drift), $P^+$ doped region 28 as the anode, and an $N^+$ doped region 30 as the cathode. This conventional technology, referred to as RESURF, uses a low doped drift region to reduce the junction field. This RESURF high voltage diode achieves a high breakdown voltage (BV) at the expense of high on-resistance ($R_{on}$).

SUMMARY

In a first aspect, the present invention is a diode, including (a) a semiconductor substrate, (b) a first region doped with a first dopant type in the substrate, (c) a second region doped with a second dopant type in the substrate, (d) a first well of the first dopant type in the substrate, surrounding the first region and the second region, and (e) a second well of the second dopant type in the substrate, connecting the first region and the second region. The first dopant type is opposite the second dopant type.

In a second aspect, the present invention is a diode, including (a) a semiconductor substrate, (b) a first region doped with a first dopant type in the substrate, (c) a second region doped with a second dopant type in the substrate, (d) a first floating well of the first dopant type in the substrate, surrounding the first region and the second region, (e) a second well of the second dopant type in the substrate, connecting the first region and the second region, and (f) a shallow trench isolation region in the substrate, between the first region and the second region. The first dopant type is opposite the second dopant type, dopant density of the first region is $10^{-14}$ to $10^{-18}/cm^3$, the first region is a distance of 5 to 10 microns from the second region, and the diode has a breakdown voltage of 50-200 V.

DETAILED DESCRIPTION

The present invention makes use of the discovery of a new diode that includes a third implanted region, which decreases the electric field by fully depleting the conduction path. The diode may be used as a CMOS embedded high voltage diode that is compatible with any standard CMOS process. The diode may be made with a breakdown voltage (BV) of 10-500 volts, preferably 91 volts or greater, while maintaining low on-resistance ($R_{on}$). Furthermore, BV and $R_{on}$ may be individually adjusted with little tradeoff.

Figure 2:
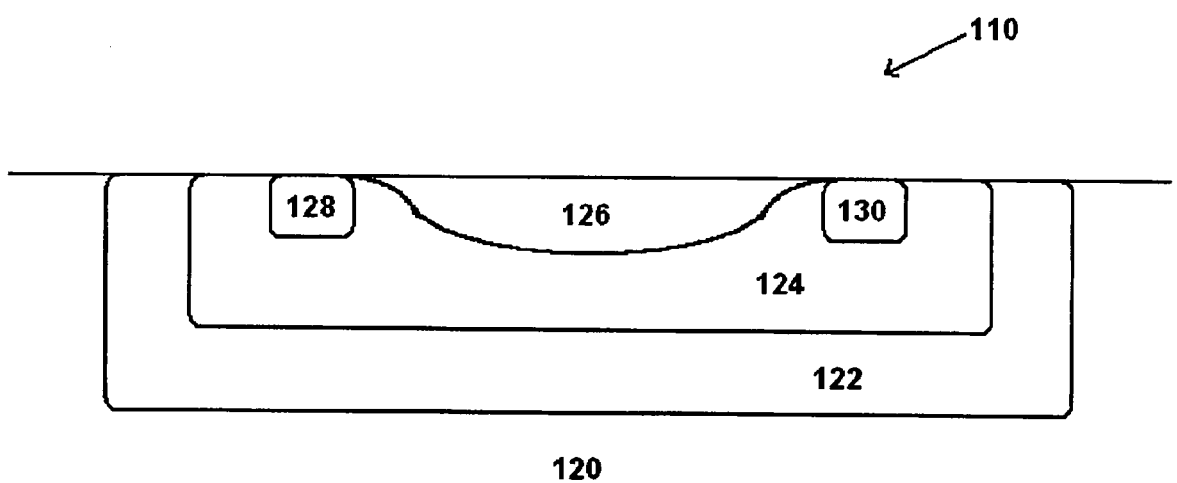
FIG. 2 shows a diode.

FIG. 2 illustrates a diode 110 of the present invention. As shown in FIG. 2, a semiconductor substrate 120 of a first dopant type (N or P) includes a deep (first) well 122 of the opposite (second) dopant type (P or N, giving a deep P-well or deep N-well, respectively). On the deep well 122 is a second well 124 of the first dopant type (N or P, giving an N-well or P-well, respectively). The doping of these two wells should be balanced, so that the second well is fully depleted by the first well. Also illustrated are a first doped region 128 of the second dopant type (P or N, give a $P^+$ region or an $N^+$ region, respectively) as the anode, and a second doped region 130 of the first dopant type (N or P, give an $N^+$ region or a $P^+$ region, respectively) as the cathode, both in the substrate and on the second well. The first and second doped regions are connected by the second well. Optionally, between the first doped region 128 and a second doped region 130, and in the substrate, may be an isolation region 126, such as a shallow trench isolation (STI) region.

When reverse biased, the first doped region punches through the deep well, and the deep well causes the second well to be fully depleted, resulting in superb BV characteristics. When the diode is forward biased, the deep well does not participate in the diode function, and acts as an isolation layer. To reduce $R_{on}$, the deep well and the second well doping levels may be increased, without reducing the BV.

Figure 1:
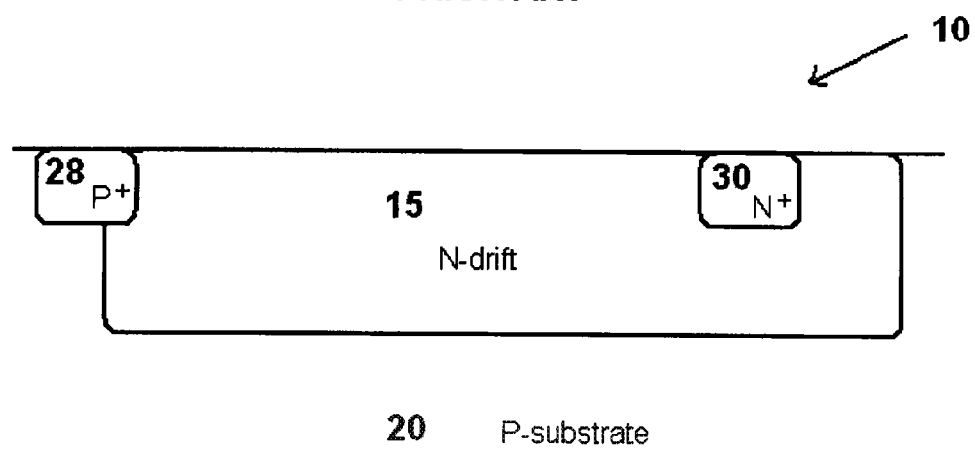
FIG. 1 shows a conventional high voltage diode.

The deep (first) well and the second well preferably have dopant densities which are balanced with respect to each other. By having the balanced dopant densities, the deep well will cause the second well to become fully depleted. The dopant density of the deep well and the second well are preferably $10^{-14}$ to $10^{-18}/cm^3$, more preferably $10^{-15}$ to $10^{-16}/cm^3$. Preferably, the deep well is a deep N-well, the second well is a P-well, and the substrate is lightly P-doped (P-substrate). The deep well may be biased, for example by forming a contact to the deep well, or it may be a floating deep well. Preferably, the deep well surrounds the second well and the first and second doped regions, as illustrated in FIG. 1.

The distance between the first doped region and the second doped region, referred to as the diode length, may be varied to control BV. Preferably, the diode length is 0.5 to 100 microns, more preferably 2 to 20 microns, most preferably 5-10. Preferably, the BV of the diode is 5 to 500 V, more preferably 50-200 V, including 100 V.

The diode of the present invention may be used in a CMOS (compensated metal oxide semiconductor) device, such as a switch, in particular a high voltage switch. The diode or a CMOS device including the diode may be used in a voltage regulator, such as a high voltage regulator for reducing a 20 V input to a 5 V output.

Figure 3:
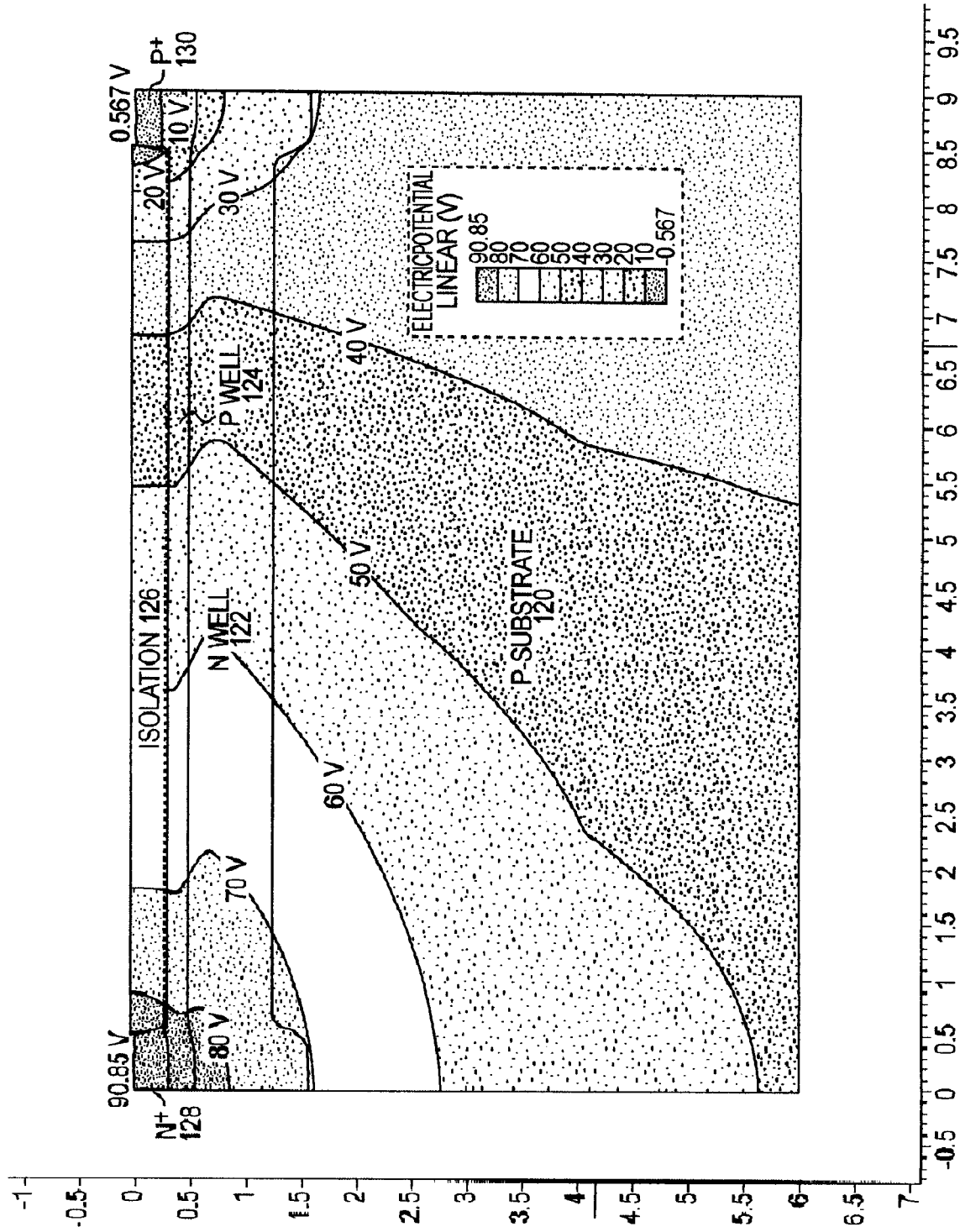
FIG. 3 shows a simulated electric potential profile of a diode at 91 V.

FIG. 3 shows the simulated potential profile of the diode produced by non-optimized TCAD simulation at 91 V. In the simulation, dopant types are as illustrated, with the substrate 120 lightly P-doped, the deep well 122 N doped, the second well 124 P doped, the anode 128 $N^+$ doped and the cathode 130 $P^+$ doped. A shallow trench isolation region 126 is included. The distances between device elements are shown using the scales along the X- and Y-axes, in microns. The lines separating the different shaded regions are equal potential lines, have a potential as labeled in the illustration, in volts. In a similar simulation, identical except for the inclusion of the deep N-well, the BV was 12 V, rather than the BV of 91 in the simulation illustrated in FIG. 3.

Various processing may be used to form the semiconductor devices. For example, doped regions may be formed in the substrate by ion implantation, gate stacks and spacers may be formed deposition, patterning and/or etching, additional dielectric layers may be formed on the substrate by deposition, patterning and/or etching, and other contacts and metallization layers may also be formed on these structures.

The processing steps, including etching, implanting, polishing, cleaning, patterning and depositing, as well as various CMOS devices, for use with the present invention, are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; Wolf, Silicon Processing for the VLSI Era, Lattice Press, 1986, 1990, 1995, 2002 (vols. 1-4, respectively); Microchip Fabrication 5th. edition, Peter Van Zant, McGraw-Hill, 2004; U.S. Pat. No. 6,593,725 issued Jul. 15, 2003 to Gallagher et al.; and U.S. Pat. No. 7,023,259 issued Apr. 4, 2006 to Daniell et al.

The semiconductor devices of the present invention may be incorporated into other semiconductor devices, such as an integrated circuit, for example a memory cell such as an SRAM, a DRAM, an EPROM, an EEPROM etc.; a programmable logic device; a data communications device; a clock generation device; a high voltage regulator; a high voltage rectifier; a high voltage switch; etc. Furthermore, any of these semiconductor devices may be incorporated in an electronic device, for example a computer, mobile phone, an airplane or an automobile.

What is claimed is:

1. A diode, comprising:
   (a) a semiconductor substrate,
   (b) a first region doped with a first dopant type, in the substrate,
   (c) a second region doped with a second dopant type, in the substrate,
   (d) a first well of the first dopant type, in the substrate, surrounding the first region and the second region, and
   (e) a second well of the second dopant type, in the substrate, connecting the first region and the second region, the second well configured to be substantially fully depleted by the first well when the diode is reverse biased and configured to be substantially isolating when the diode is forward biased, wherein the first dopant type is opposite the second dopant type.

2. The diode of claim 1, further comprising an isolation region, in the substrate, between the first region and the second region.

3. The diode of claim 2, wherein the isolation region is a shallow trench isolation.

4. A voltage regulator, comprising the diode of claim 2.

5. A high voltage switch, comprising the diode of claim 2.

6. A high voltage rectifier, comprising the diode of claim 2.

7. The diode of claim 1, wherein the first well is a floating well.

8. The diode of claim 1, wherein the first region is a distance of 0.5 to 100 microns from the second region.

9. The diode of claim 1, wherein the first region is a distance of 2 to 20 microns from the second region.

10. The diode of claim 1, wherein the diode has a breakdown voltage of 5 to 500 V.

11. The diode of claim 1, wherein the diode has a breakdown voltage of 50-200 V.

12. A CMOS device, comprising the diode of claim 1.

13. An electronic device, comprising the diode of claim 1.

14. A diode, comprising:
   (a) a semiconductor substrate,
   (b) a first region doped with a first dopant type, in the substrate,
   (c) a second region doped with a second dopant type, in the substrate,
   (d) a first floating well of the first dopant type, in the substrate, surrounding the first region and the second region,
   (e) a second well of the second dopant type, in the substrate, connecting the first region and the second region, the second well configured to be substantially fully depleted by the first floating well when the diode is reverse biased and configured to be substantially isolating when the diode is forward biased, and
   (f) a shallow trench isolation region, in the substrate, between the first region and the second region, wherein the first dopant type is opposite the second dopant type, the first region is a distance of 2 to 20 microns from the second region, and the diode has a breakdown voltage of 50-200 V.

15. A CMOS device, comprising the diode of claim 14.

16. An electronic device, comprising the diode of claim 14.

17. In a CMOS embedded diode, including an anode and a cathode in a semiconductor substrate, and a first well connecting the anode and the cathode, the improvement comprising a deep well, in the substrate, surrounding the anode and the cathode, the deep well configured to deplete the first well when the CMOS embedded diode is reverse biased and configured to be substantially isolating when the CMOS embedded diode is forward biased.

18. The CMOS embedded diode of claim 17, further comprising an isolation region, in the substrate, between the anode and the cathode.

* * * * *